(12) United States Patent
Raj et al.

(10) Patent No.: US 8,207,752 B2
(45) Date of Patent: Jun. 26, 2012

(54) FAULT-TOLERANT MULTI-CHIP MODULE

(76) Inventors: Kannan Raj, San Diego, CA (US);
Xuezhe Zheng, San Diego, CA (US);
Ashok V. Krishnamoorthy, San Diego, CA (US); Ronald Ho, Mountain View, CA (US); Michael O. McCracken, Austin, TX (US); David K. McElfresh, San Diego, CA (US); John E. Cunningham, San Diego, CA (US)

( * ) Notice: Subject to any disclaimer, the term of this patent is extended or adjusted under 35 U.S.C. 154(b) by 0 days.

(21) Appl. No.: 12/685,159

(22) Filed: Jan. 11, 2010

(65) Prior Publication Data

US 2011/0169522 A1 Jul. 14, 2011

(51) Int. Cl.
*H03K 19/003* (2006.01)
(52) U.S. Cl. ............... 326/10; 326/38; 326/39; 370/388; 370/411; 721/33
(58) Field of Classification Search ......... 326/10.37–39; 370/388, 411; 712/32–33; 713/375, 400–401
See application file for complete search history.

(56) References Cited

U.S. PATENT DOCUMENTS

| 5,455,525 | A | * | 10/1995 | Ho et al. | 326/41 |
| 5,832,294 | A | * | 11/1998 | Reinschmidt | 712/32 |
| 6,094,066 | A | * | 7/2000 | Mavis | 326/41 |
| 7,042,248 | B1 | * | 5/2006 | Hutton et al. | 326/41 |
| 7,251,386 | B1 | * | 7/2007 | Dickinson et al. | 385/14 |
| 7,259,031 | B1 | * | 8/2007 | Dickinson et al. | 438/23 |
| 2002/0133727 | A1 | * | 9/2002 | Dervin et al. | 713/310 |
| 2003/0046596 | A1 | * | 3/2003 | Floyd et al. | 713/400 |
| 2006/0179364 | A1 | * | 8/2006 | Swaney et al. | 714/100 |
| 2006/0242442 | A1 | * | 10/2006 | Armstrong et al. | 713/400 |
| 2009/0066361 | A1 | * | 3/2009 | Fuseya | 326/10 |
| 2010/0150147 | A1 | * | 6/2010 | Khanduri | 370/388 |

* cited by examiner

*Primary Examiner* — Jason M Crawford
(74) *Attorney, Agent, or Firm* — Park, Vaughan, Fleming & Dowler LLP; Steven E. Stupp (57) ABSTRACT

A multi-chip module (MCM) is described. This MCM includes multiple sites, where a given site in the multiple sites includes multiple chips with proximity connectors that communicate information through proximity communication within the MCM via multiple components associated with the given site. Note that the MCM includes global redundancy and local redundancy at the given site. In particular, the global redundancy involves providing one or more redundant sites in the multiple sites. Furthermore, the local redundancy involves providing one or more redundant chips in the multiple chips and one or more redundant components in the multiple components.

20 Claims, 9 Drawing Sheets

FAULT-TOLERANT MULTI-CHIP MODULE

GOVERNMENT LICENSE RIGHTS

The United States Government has a paid-up license in this invention and the right in limited circumstances to require the patent owner to license others on reasonable terms as provided for by the terms of Agreement No. HR0011-08-9-0001 awarded by the Defense Advanced Research Projects Administration.

BACKGROUND

1. Field

The present disclosure relates to a multi-chip module (MCM) that accommodates semiconductor chips. More specifically, the present disclosure relates to an MCM that provide fault tolerance by using redundant components and semiconductor chips.

2. Related Art

In the next few years, high-performance computing (HPC) systems with petaflops of computing power and petabytes of storage will be replaced with 'exascale' systems. With the deployment of exascale systems comprising hundreds of thousands of interconnected processors, orders of magnitude of additional performance is expected. This computational and storage power in a single system will be equivalent to the collective computing power of the Top-500 supercomputers which currently exist.

One goal for HPC systems is to provide an extremely high level of reliability, availability and serviceability (RAS). In order to achieve high RAS, yearly downtime will need to be minimized. Consequently, fault tolerance and fault management are important considerations in the design of HPC systems. In particular, as the complexity of computer systems grows, achieving high RAS in HPC systems will involve one or more of the following: a scalable architecture for maximum performance and throughput; component, package, and integration-level reliability; interconnect technology with link-level reliability; elimination of single points of failure; fault tolerance; thermal management; and scalable software.

Recently, engineers have proposed using a multi-chip module (MCM) (which is sometimes referred to as a 'macrochip') to integrate a collection of semi-conductor chips together in an HPC system. An MCM can offer unprecedented computational density, energy efficiency, bisection bandwidth and reduced message latencies. These characteristics can be obtained by photonically interconnecting multiple silicon chips into a logically contiguous piece of silicon. This interconnection technique can be used to integrate various computer-system components, such as: multi-core, multi-threaded processors, system-wide interconnects and dense memories. However, the complexity of the MCM and the associated large number of integrated components can give rise to additional failure modes, which can increase failure-in-time (FIT) rates, and can thereby degrade RAS.

Hence, what is needed is an MCM without the above-described problems.

SUMMARY

One embodiment of the present disclosure provides a multi-chip module (MCM) that includes multiple sites, where a given site includes multiple chips with proximity connectors that communicate information through proximity communication within the MCM via components associated with the given site. Note that the MCM includes global redundancy and local redundancy at the given site. In particular, the global redundancy involves providing one or more redundant sites in the multiple sites. Furthermore, the local redundancy involves providing one or more redundant chips in the multiple chips and one or more redundant components in the multiple components.

In some embodiments, a given one of the one or more redundant sites, the one or more redundant chips, and/or the one or more redundant components is in a standby mode until a failure or an impending failure of a corresponding one of the multiple sites, the multiple chips, and/or the multiple components is detected in the MCM. For example, the MCM may include control logic that monitors a status of the multiple sites, the multiple chips, and the multiple components during operation of the MCM. Note that the status may include: performance of the multiple sites, the multiple chips and the multiple components during operation of the MCM. Alternatively or additionally, the status may include a communication metric associated with the proximity communication, such as a communication metric associated with transmitting or receiving of an optical signal during the proximity communication (for example, a signal amplitude or a signal-to-noise ratio).

Furthermore, the MCM may include a telemetry-monitoring mechanism that monitors parameters associated with operation of the multiple sites, the multiple chips, and the multiple components. In these embodiments, the status may be based on the monitored parameters. Additionally, the telemetry-monitoring mechanism may be distributed at two or more locations in the MCM.

In some embodiments, the control logic transitions a given one of the one or more redundant sites, the one or more redundant chips, and/or the one or more redundant components from a standby mode to an operating mode based on the status. This control logic may be centralized at a particular location in the MCM or may be distributed at two or more locations in the MCM.

Note that the proximity communication may include optical proximity communication of optical signals. Consequently, the MCM may include optical links, where the optical proximity communication between a given pair of the multiple chips occurs via one or more of the optical links. Furthermore, the multiple components may include optical sources, such as lasers.

In some embodiments, the MCM has a fully connected, non-blocking topology so that a given chip at the given site can communicate with any other chip in the MCM. Moreover, the global redundancy and the local redundancy may preserve the fully connected, non-blocking topology in the event of failures or impending failures of a given one of the one or more redundant sites, the one or more redundant chips, and/or the one or more redundant components.

Another embodiment provides a system that includes the MCM.

Another embodiment provides a method for operating the MCM. During operation, the status of multiple sites in the MCM is monitored, including multiple chips at the given site that communicate information within the MCM through proximity communication via multiple components associated with the given site. Then, a failure or impending failure is determined at a given one of the multiple sites, the multiple chips, and/or the multiple components based on the status. Next, a given one of one or more redundant sites, one or more redundant chips, and/or one or more redundant components is transitioned from the standby mode to the operating mode based on the determined failure or the impending failure.

Table 1 provides component information for an MCM in accordance with an embodiment of the present disclosure.

Table 2 provides representative failure-in-time (FIT) rates for components in high-performance computing (HPC) systems in accordance with an embodiment of the present disclosure.

Table 3 provides redundancy configurations in an MCM in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of a multi-chip module (MCM), a system that includes the MCM, and a technique for operating the MCM are described. This MCM includes multiple sites, where a given site in the multiple sites includes multiple chips with proximity connectors that communicate information through proximity communication within the MCM via multiple components associated with the given site. Note that the MCM includes global redundancy and local redundancy at the given site. In particular, the global redundancy is provided by one or more redundant sites in the multiple sites. Furthermore, the local redundancy is provided by one or more redundant chips in the multiple chips and one or more redundant components in the multiple components.

By providing local and global redundancy, the MCM solves the problem of high RAS in this high-performance computing (HPC) system. In particular, when failures occur or are impending, control logic in the MCM, which monitors the status or performance of the MCM, can transition a given one of the one or more redundant sites, the one or more redundant chips and/or the one, or more redundant components from a standby mode to an operating mode.

Figure 1:
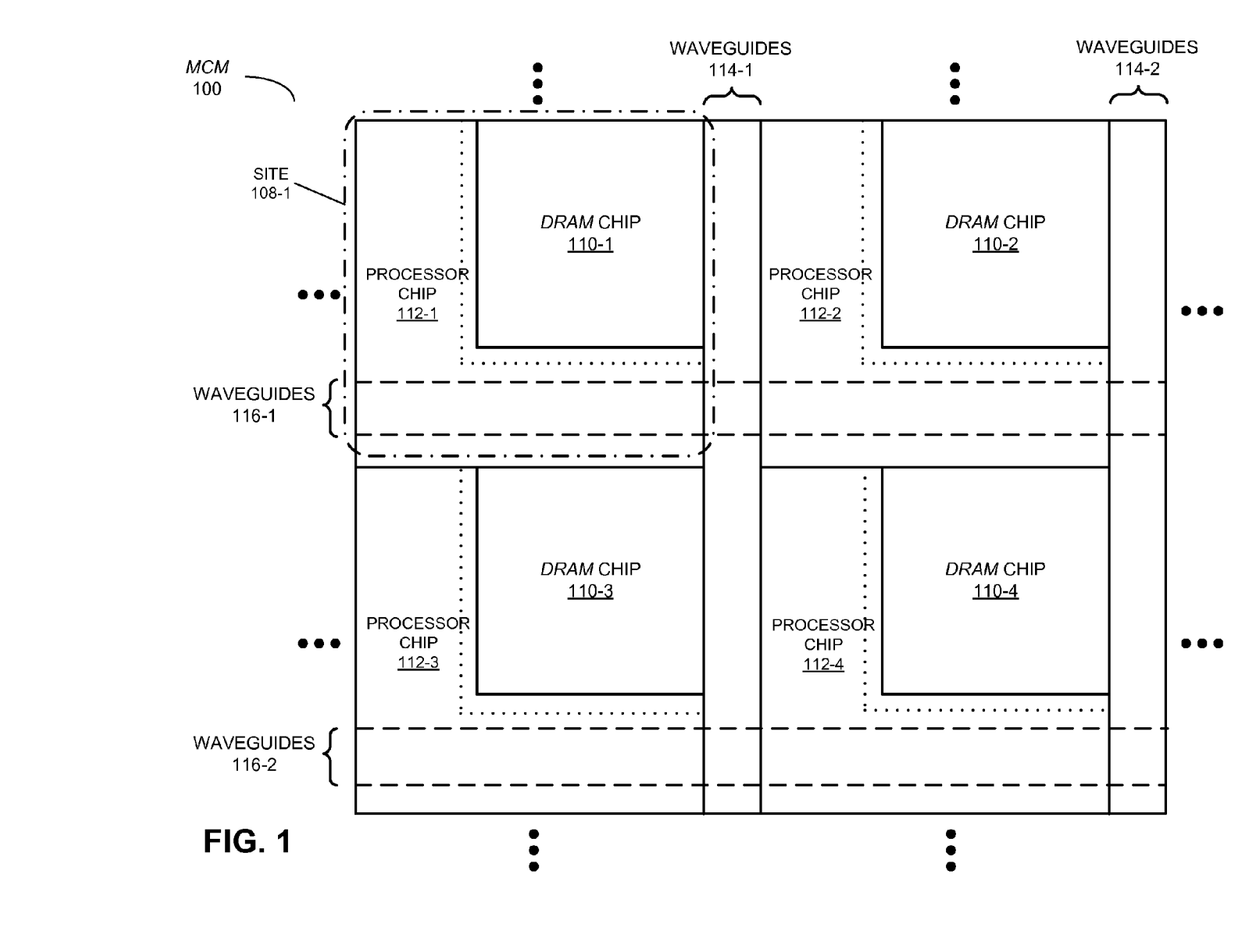
FIG. 1 is a block diagram illustrating a multi-chip module (MCM) in accordance with an embodiment of the present disclosure.

We now describe embodiments of the MCM. FIG. 1 presents a block diagram illustrating an MCM 100. This MCM includes multiple sites, where a given site (such as site 108-1) in the multiple sites includes multiple chips (such as DRAM chip 110-1 and processor chip 112-1, or a three-dimensional stacked combination of processor chips and/or memory chips using appropriately thinned chips to reduce topological variations) with proximity connectors that communicate information through proximity communication within MCM 100 via multiple components associated with the given site. As described further below, MCM 100 may include two waveguide routing layers or links (which, respectively, include waveguides 114 and 116) that couple DRAM on DRAM chips 110 to processors on processor chips 112.

DRAM chips 110 and processor chips 112 in MCM 100 may be fabricated using a wide variety of materials and processing techniques, as is known to one skilled in the art. In some embodiments, these chips are fabricated on semiconductor substrates, such as silicon. (However, in other embodiments, other materials, such as glass or sapphire, are used.) Note that the given site may contain not only different chip functions, but also different basic technologies. Electrical components may be built up on these substrates using a complementary-metal-oxide-semiconductor (CMOS) process, and optical components may be built up on these substrates using a silicon-on-insulator (SOI) process. In these embodiments, optical waveguides, such as waveguide 114 and 116, are in active layers, which may be SOI layers.

Note that MCM 100 may include structures that facilitate alignment of DRAM chips 110 and processor chips 112. For example, there may be negative features (such as pits) that are defined on surfaces of these chips. These negative features may mechanically couple to positive features, thereby mechanically coupling and aligning DRAM chips 110 and processor chips 112. In particular, the positive features may be micro-spheres (such as micro-solder balls) that mechanically couple to or mate with pairs of negative features on surfaces of adjacent chips.

In some embodiments MCM 100 is composed of silicon photonic building blocks. In particular, it may be a logically contiguous piece of photonically interconnected silicon integrating: multi-core, multi-threaded processors, system-wide interconnect, and dense memories. These components may offer unprecedented: computational density, energy efficiency, bisection bandwidth, and reduced message latencies. As described further below with reference to FIG. 4, 'optical proximity communication' of optical signals may couple the processor cores on different sites to optical layers (which include waveguides 114 and 116) that route the optical links. These links may enable low-latency, wavelength-division multiplexed (WDM) optical links between sites (such as site 108-1). This interconnection network may use silicon waveguides and vertical silicon couplers to achieve point-to-point, non-blocking links for every site on MCM 100.

MCM 100 may enable more processor and system interconnects to be integrated into a single node, offering the potential for breakthrough performance per unit of power and floor space. As described further below, MCM 100 may use lateral packaging. This lateral topology can exploit the long 'reach' of optics by amortizing the signaling power over longer distances, and can allow 'fat' compute nodes that enable rich, high-degree interconnected topologies (such as all-to-all interconnects) even when scaling up to a multi-node supercomputer. A non-blocking, point-to-point WDM routing network used in some embodiments of the MCM typically has superior performance and no setup delays when compared to an electrically controlled, packet-switched network of the same bandwidth. In addition, it may further simplify the control of the network and may eliminate the resulting power required for network resource arbitration. Note that the static WDM non-blocking network topology also can provide efficient transport for small messages (64B or less), which may be useful in supporting shared memory machines, and which also can facilitate embedded machines where performance-per-Watt on specific HPC metrics, such as GUPS/Watt and FFT/Watt, is increased or maximized.

The logical architecture of MCM 100 may be based on an N×N array of sites (e.g., where N is 8 or larger). Each site may have multiple cores within a processor (four or six cores for examples) and DRAM (for example, 8 GB). The ample amount of DRAM per site may lead naturally to a wafer-sized MCM implemented on an SOI platform that packages CPUs, memory, silicon photonics, and fiber interfaces. In particular, MCM 100 may contain 64 sites (or super cores) in an 8×8 matrix, with each site including a 400 mm$^2$ DRAM chip. A bridge chip (such as processor chip 112-1) may be mounted face-down over the DRAM chip (such as DRAM chip 110-1). The bridge chip may include a processor and a system interface, and may communicate with the DRAM chip using 'electrical proximity communication' (for example, via capacitive coupling) and to waveguides (such as waveguides 114-1 and 116-1) using optical proximity communication. Note that the 64 sites may be coupled by a static point-to-point 8×8 WDM network, which is described further below with reference to FIGS. 2-4.

Thus, each site may include, for example, four 40 Gflop cores, 8 GB of DRAM, and a system interface. The system interface may couple the four cores to their DRAM slice, and may have 64 links, which, for example, are each 10 GB/s (in and out), coupling to the 64 sites in the processor. This yields 640 GB/s (in and out) of aggregate network bandwidth per site, and a bisection bandwidth of 10 TB/s. To match the 640 GB/s of network port bandwidth, each site may have 640 GB/s of bandwidth (in and out) to the system interface. Furthermore, the DRAM may have a 2 ns access time and a 64 B wide interface. Consequently, there may be 20 banks per slice. Additionally, external input/output (I/O) may be coupled via an additional pair of optical waveguides, yielding 40 GB/s (in and out) of I/O bandwidth. These waveguides may be routed from the system interfaces at each site or super-core to fiber interconnectors at the edges of the DRAM/processor slices.

Note that the cores may be multi-threaded, four-issue, out-of-order processors supporting 2 double-precision, multiply-add operations per cycle. These processors may be optimized to run, for example, at 10 GHz in 22 nm technology. In addition, note that custom-designed 22 nm DRAM (in specific technology nodes such as the 22 nm node), optimized for bandwidth and power may be used. For example, an open bitline DRAM array with 50% logic overhead packs 8 GB of capacity in a 400 mm$^2$ chip. This provides 32 GB of memory in a four-level stack. By heavily banking the memory, a total memory bandwidth of 640 B/s per slice may be obtained, with a cycle time and latency of 2 ns.

Figure 2:
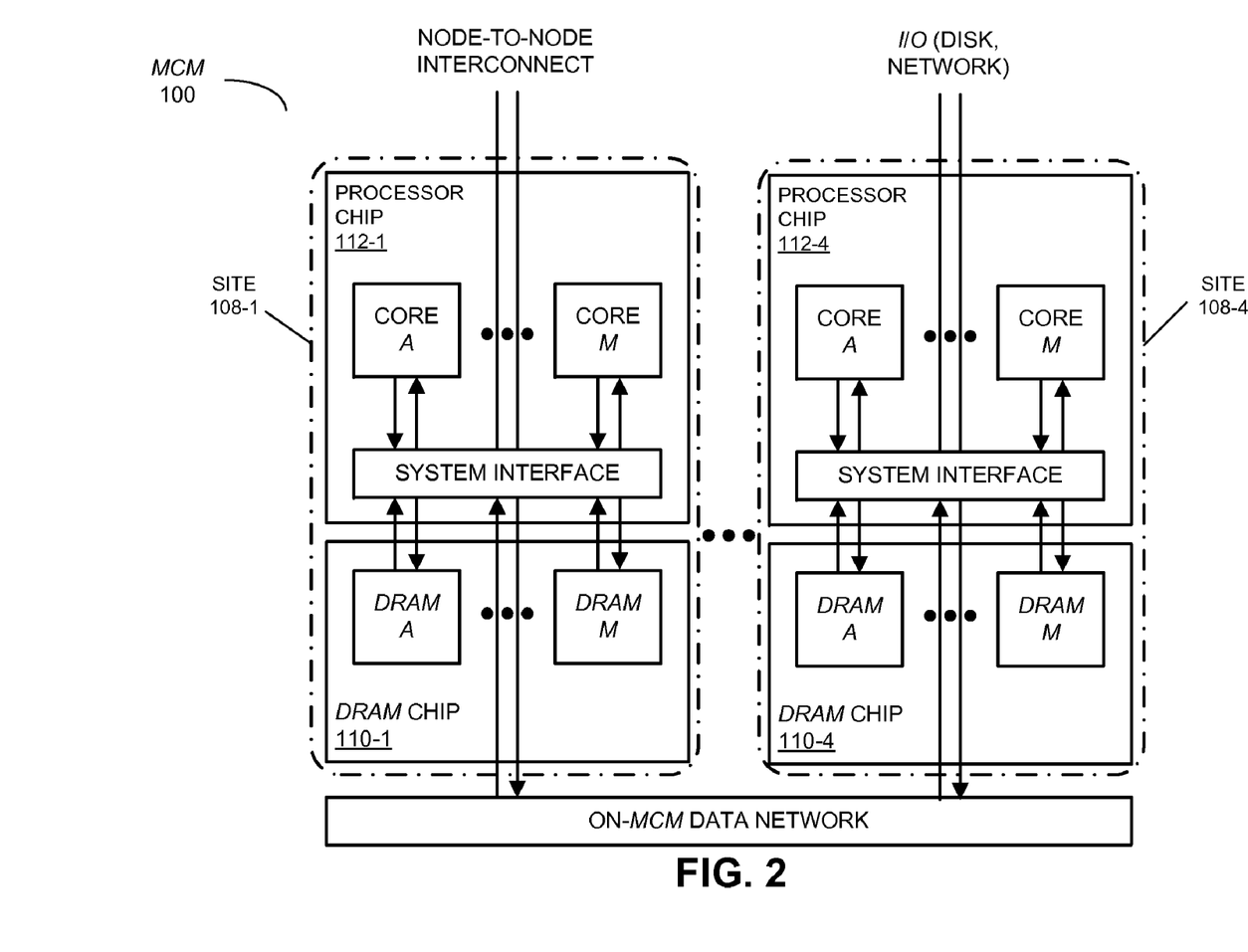
FIG. 2 is a block diagram illustrating a portion of the MCM of FIG. 1 in accordance with an embodiment of the present disclosure.
Figure 3:
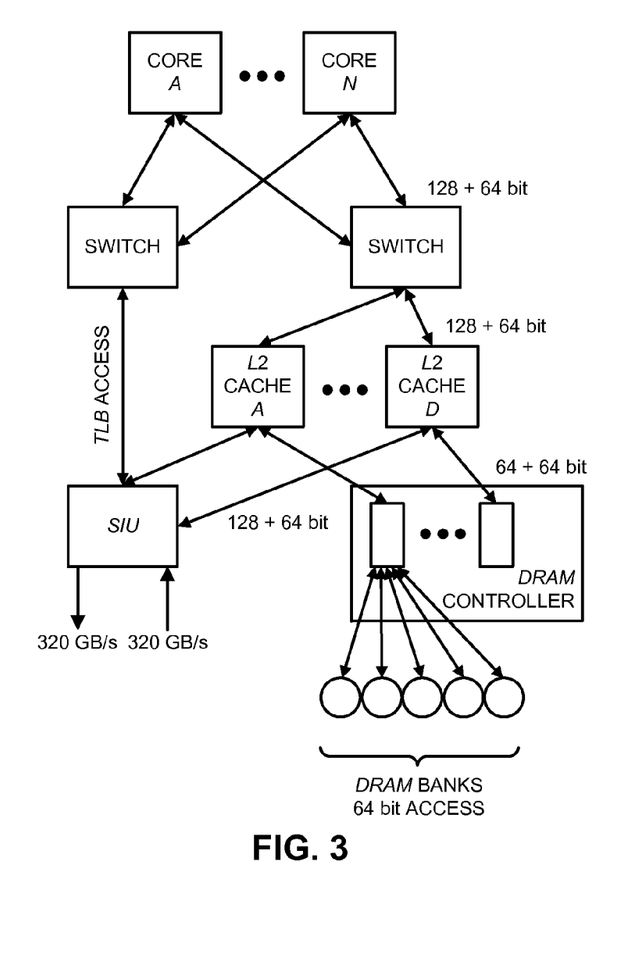
FIG. 3 is a block diagram illustrating a given site in the MCM of FIG. 1 in accordance with an embodiment of the present disclosure.

An MCM-based system may interconnect hundreds of message-passing multiprocessors and custom high-bandwidth DRAM chips with optics. As noted previously, it may be based on an SOI platform that packages and aggregates CPUs, memory, silicon photonics, and fiber interfaces. Note that a canonical system can be as small as a single MCM, or may combine more than a thousand MCMs tied together with a dense fully connected fiber network. Consequently, the MCM may be an array of 'sites' (such as site 108-1) interconnected with silicon photonics (such as waveguides 114 and 116). FIG. 2 presents a block diagram illustrating a portion of MCM 100 (FIG. 1). In particular, FIG. 2 shows four sites 108 coupled with the on-MCM data network, which may be implemented using silicon photonics. Furthermore, FIG. 3 presents a block diagram illustrating a given site (such as site 108-1 in FIGS. 1 and 2) in MCM 100 (FIG. 1). Each site in MCM 100 may include: a processor, cache, DRAM, a switch (such as a cross-bar switch), and a system interface unit (SIU).

Figure 4:
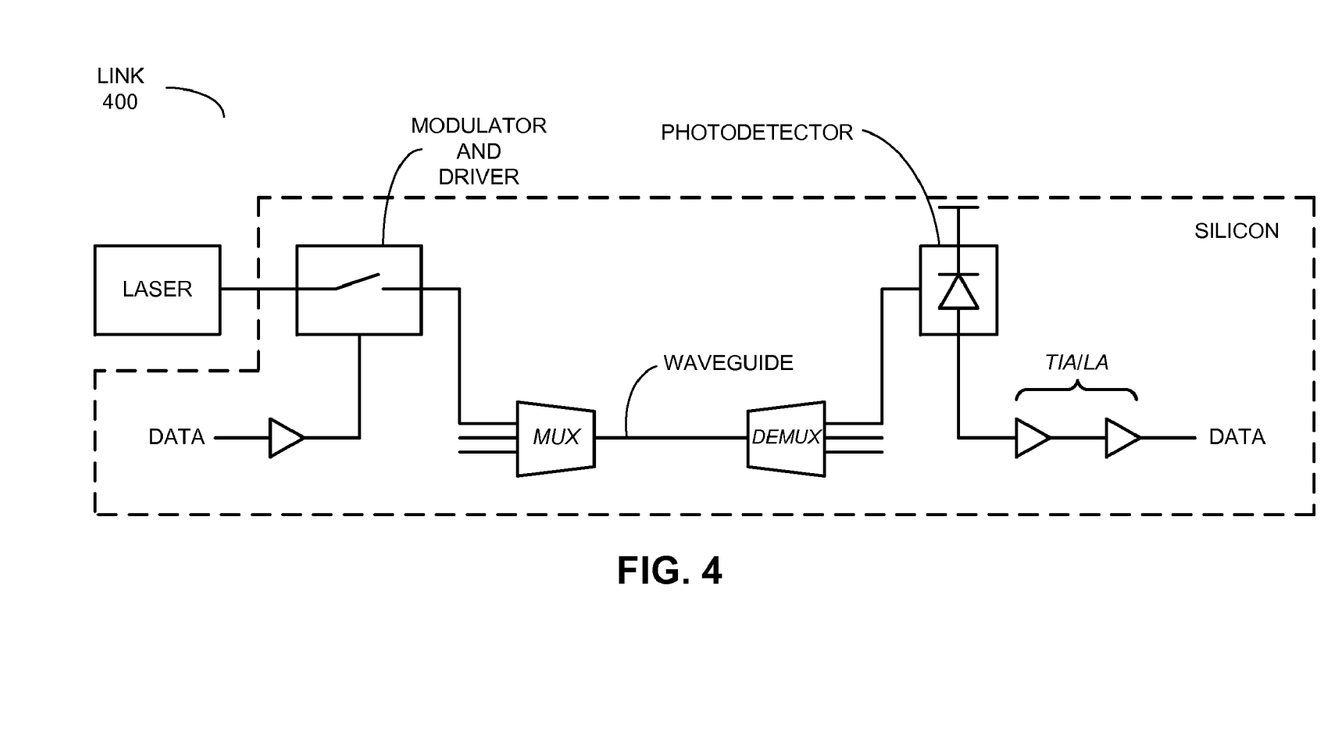
FIG. 4 is a block diagram illustrating a link in the MCM of FIG. 1 in accordance with an embodiment of the present disclosure.

As shown in FIG. 4, which presents a block diagram illustrating a link 400 in MCM 100 (FIG. 1), each site (such as site 108-1 in FIGS. 1 and 2) may be coupled to every other site via the on-MCM data network at the physical link layer via transmit and receive nodes. Note that the transmit node may include an array of optical sources (such as light sources or light emitters, for example, one or more lasers) and arrays of silicon photonic modulators and drivers. These optical sources may be implemented on-chip or may be external components. In addition, link 400 may include components such as: a router, a multiplexer or MUX (such as an add filter), a filter and/or a switch. For example, there may be an add filter for use in wavelength-division multiplexing. Note that these and other components in link 400 may be implemented using optical components and/or electrical circuits.

After the data is optically multiplexed, it may be coupled to one or more on-silicon waveguides (for example, using optical couplers such as grating elements, mirrors or diffraction grating) and communicated to another chip at the same or another site. On the receiver end, the optical signals may be: demultiplexed (for example, using a demultiplexer or DEMUX, such as a drop filter), detected with arrays of detectors (such as photodetectors, amplifiers, etc.), and converted to ones and zeros by receivers in the form of transimpedance amplifiers (TIA) and/or a low-noise amplifier (LA), which are followed by retimers.

Figure 5:
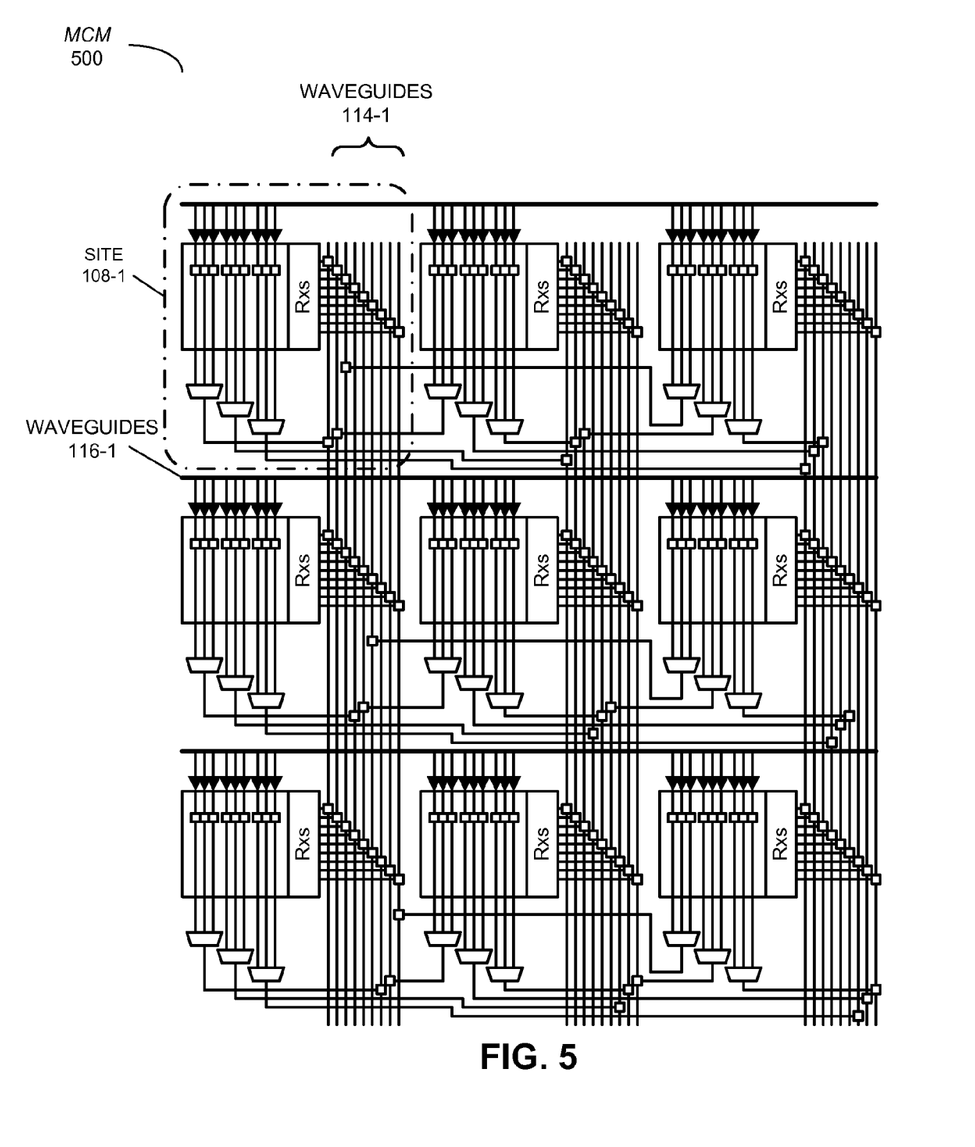
FIG. 5 is a block diagram illustrating point-to-point links in an MCM in accordance with an embodiment of the present disclosure.

As shown in FIG. 5, which presents a block diagram illustrating WDM point-to-point links in an MCM 500, this transmit-receive pair may be expanded to implement the MCM array. This 3×3 array (which can scale to N×N) can provide a fully connected WDM point-to-point network. In particular, every processor may communicate with every other processor on this network (i.e., there is a link from any node to any other node) based on the choice of: laser wavelength, the multiplexor and/or waveguide. In some embodiments, there is no arbitration en route and no waveguide crossings, so this interconnection technique provides the minimum latency for communication.

Figure 6:
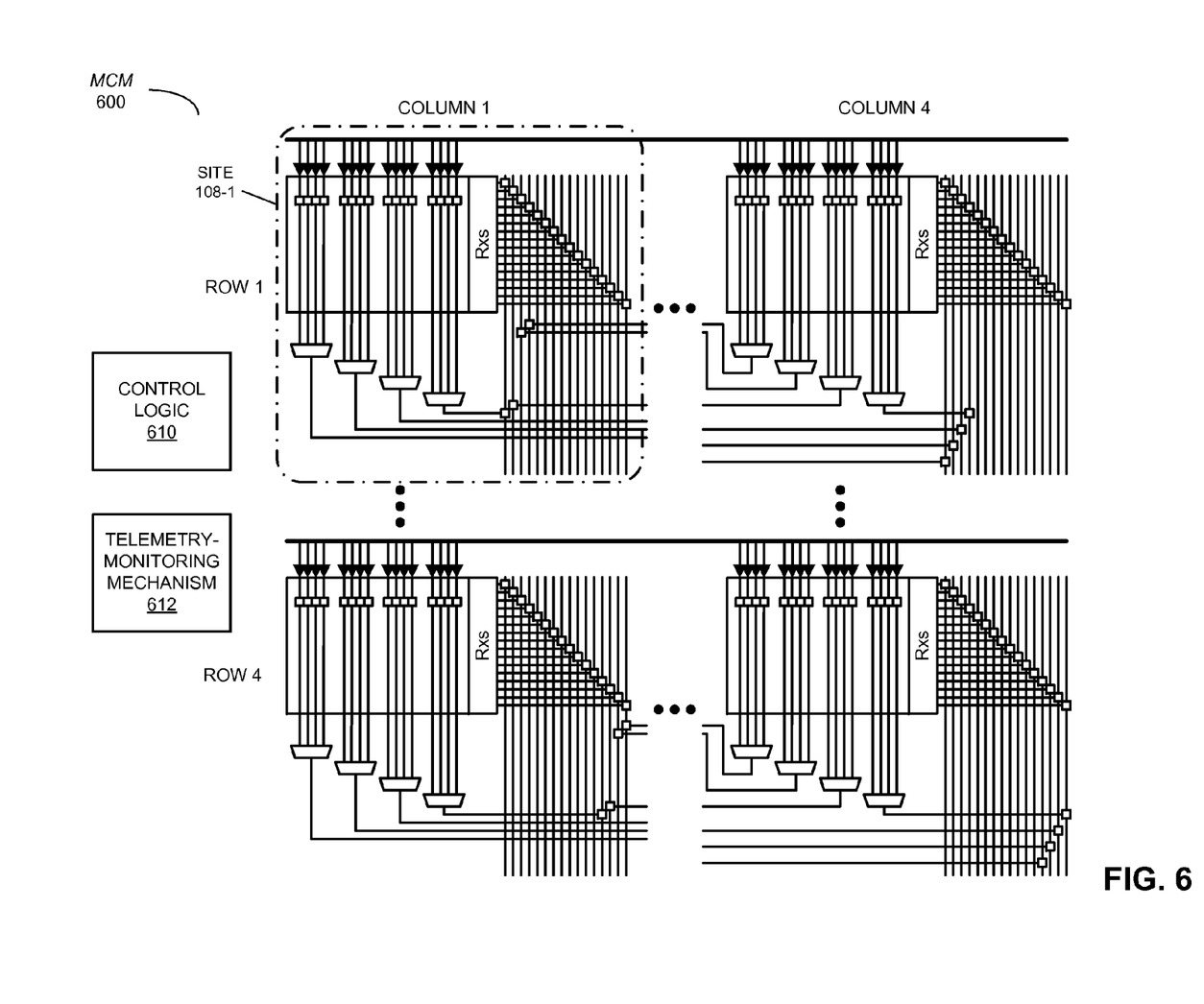
FIG. 6 is a block diagram illustrating global redundancy in an MCM in accordance with an embodiment of the present disclosure.

Furthermore, note that each site may be coupled to horizontal and vertical waveguides (such as waveguides 114-1 and 116-1) in two separate waveguide layers. Additionally, each site may have a laser array with N$^2$ wavelengths in N groups each, as well as N$^2$ detectors in N groups. Table 1 provides component information for the physical layer in an N×N site MCM. (Note that the components in FIGS. 5 and 6 are described further below in the discussion of FIG. 7.)

TABLE 1

| Component | Quantity | Comment |
|---|---|---|
| Sites (processors, DRAM, L2 cache, switch, SIU) | N$^2$ | N×N array |
| Lasers | 2N$^4$ | N$^2$ per site arranged in groups of N |
| Modulators and drivers | 2N$^4$ | N$^2$ per site arranged in groups of N |

TABLE 1-continued

| Component | Quantity | Comment |
|---|---|---|
| Multiplexers | $2N^3$ | N multiplexers per site |
| Demultiplexers | $2N^3$ | N demultiplexers per site |
| Detectors and receivers | $2N^4$ | $N^2$ per site arranged in groups of N |
| Routing waveguides | $2N^2$ | $N^2$ horizontal and $N^2$ vertical |

A wide variety of failure modes can occur in HPC systems. For example, component failures may include: hard disk drives (HDDs), power supplies, I/O units, CPUs, switches, line cards, fabric cards, memory, fans, cables, packages, connectors, and/or other components. Common failures due to power supplies and fans can be mitigated by the addition of spares, such as: extra power supplies and voltage regulator modules. Furthermore, mechanical failures can be limited by reducing the number of moving parts and limiting the number of surface-mount components. Additionally, HDDs may be coupled to dual paths to overcome a possible controller failure, and interconnects may use link-level reliable transport. Note that at least some of the HDDs may be hot-swappable so that routine operations are not affected when an HDD is replaced.

Table 2 provides representative failure-in-time (FIT) rates for components in HPC systems based on repair data. Note that one FIT is defined as one failure in a billion hours, and the mean time to failure (MTTF) is the reciprocal of the FIT rate. As shown in the equation below, according to the sum-of-failure-rates (SOFR) model, the MTTF of a system composed of n units can be related to the lifetime of each unit due to each of the m individual failure mechanisms (assuming the failures are independent of each other). Consequently, in general, if a system includes a larger number of components, the FIT rates will be higher and the MTTF will be smaller, which implies higher downtimes and, thus, lower RAS.

TABLE 2

| Component groups | FIT rate |
|---|---|
| CPU | 636.72 |
| CPU sockets | 61.58 |
| Power supplies | 32.66 |
| ASICs | 23.73 |
| Connectors | 5.27 |
| Mechanicals | 3.83 |
| ICs (other than ASICs) | 0.79 |
| Discrete bipolars | 0.76 |
| Miscellaneous discretes | 0.52 |
| Capacitors | 0.06 |
| Resistors | 0.03 |

$$\frac{1}{MTTF} = \sum_{i=1}^{n} \sum_{j=1}^{m} \frac{1}{MTTF_{ij}}$$

A typical goal for RAS is 99.99% availability (four nines or an order four system). This translates to downtimes that cannot be higher than 52 minutes (out of 8760 hours) per year. For many HPC systems, the reboot time after a downtime (scheduled or unscheduled) is over 6 hours, which results in 99.93% availability for one downtime occurrence. This means that these HPC systems are not class 4 systems if planned downtimes are included. However, HPC users usually prefer class 4 HPC availability, and are usually willing to pay for the cost to implement such a design for their applications. This typically requires that all FIT rates must be kept as low as possible, and that redundancy and seamless fail-over switching to redundant ports be included in the system design.

For example, consider the FIT rate of 636 for CPU failures listed in Table 2. This means that there will be one CPU failure every 1.57 million hours. However, if there are 1000 processors in an HPC system, there will be at least one CPU failure every 1570 hours, which would cause numerous system downtimes in a single year. This is a catastrophic problem for system availability, especially if there are no fail-over options included in the system design. With the inclusion of a fail-over technique, the system performance usually can be maintained or can degrade a little bit without downtime (or with minimum or delayed downtime).

Note that, in the case of the MCM in this discussion, the FIT rates in Table 2 will also include the FIT rates of the optical sources, as well as the active and passive silicon photonic components. In the MCM, the sites are typically the most expensive and, from a functional perspective, are typically the most critical block of the MCM. Site failures may occur because of failures of: a CPU, memory, a controller, a switch, the SIU, the package and/or the interconnect. A site level failure could, therefore, be catastrophic, and may result in unscheduled system downtime.

Using the FIT rates, system designers can plan and implement strategies to address various failure modes, as well as taking care of single points of failure. In particular, increases in silicon level failures (from processors, DRAMs, ASICs, switches, controllers, etc.) are expected as designs progress to aggressive process-node implementations for exascale systems (for example, with 28 nm or 22 nm process nodes). Furthermore, soft errors (which result in single-event upsets, for example, because of cosmic-radiation error events) and hard errors will also increase because of device scaling and process variations. However, at the silicon level, FIT rates can be lowered by designing the chips within design rules, and incorporating some nominal margin to account for: electromigration, hot-carrier effects, negative bias-temperature instability, etc. In addition, error rates and failures can be reduced or minimized using design features, such as: added parity/error correction and/or replication of functional units with some level of redundancy.

One technique uses redundancies at all levels (spare CPUs, switches, ASICs, controllers, etc.). This redundancy allows unscheduled downtime to be deferred by keeping the process active and transferring the load or the processing to redundant nodes. Moreover, this technique can significantly reduce unscheduled service events and system downtime. Note that by deferring repairs, this technique keeps the system going even after a failure has occurred by either fail-over switching to spares or by isolating faulty sub-systems or components.

As shown in FIG. 3, in multi-core processors, independent processing cores usually share hardware resources, such as: caches, memory controllers and interconnects. In these multi-core processors, note that there may be threads running concurrently on different cores, which can affect each others' performance. Moreover, failures can occur anywhere in the SIU, and can result in sub-optimal performance or catastrophic failure (i.e., system downtime).

To avoid catastrophic failure or unscheduled downtime of such HPC systems, techniques such as CPU off-lining may be used, in which a faulty processor chip, core or thread is dynamically removed from use. (For example, in order to provide fault isolation, an entire core may be off-lined if there is a fault within a processor that is shared across threads.) Then, services tied to that active faulty processor may be transferred to other spare processors. Typically, a predetermined sequence is followed by the operating system to isolate and remove from service the faulty threads, cores and processors. This technique can avoid system interruption and system downtime (which would otherwise necessitate a full system reboot).

Moreover, memory subsystems and processors may provide diagnostics at the memory and page levels, and may provide mechanisms for retiring faulty pages. Furthermore, each memory channel may have several high-speed serial links in each direction, and may support automatic failover for continued operation even if one lane were to fail. In addition, a fair amount of hardware overhead is often used to implement error correction coding (ECC), such as single error correction with double error detection (SEC-DED), and parity protection of coherency links that ensure cache data integrity. Typically, ECC and parity protection are used in multiple hierarchies of an HPC system.

Embodiments of the MCM may provide high RAS by including global (site) redundancy (which is sometimes referred to as 'standby' redundancy), as well as local (component) redundancy (which is sometimes referred to as 'active' redundancy), while maintaining the same link features of connectivity and bandwidth afforded by the MCM. This is shown in FIG. 6, which presents a block diagram illustrating global redundancy in an MCM 600. In particular, in MCM 600 the global redundancy ensures that all sites have at least one site level spare. Furthermore, as shown below with reference to FIG. 7, the local redundancy at the given site in MCM 600 is provided by one or more redundant chips in the multiple chips and one or more redundant components in the multiple components.

In one configuration, global redundancy is accomplished by establishing spare 'sites' for each column and each row. For example, the number of rows of 'sites' can be increased by one and the number of columns of 'sites' can be increased by one. Thus, an N×N MCM with no 'site' level redundancy may be configured as an (N+1)×(N+1) array with a high level of redundancy provided by 2N+1 spare 'sites.' FIG. 6 shows an example of this configuration in 4×4 MCM 600 (i.e., where N equals 3), in which row 1 and column 1 contain the seven spare or redundant sites, such as site 108-1 (as described further below, all of these redundant sites may be in a standby mode). Note that the remainder of MCM 600 (rows 2-4 and columns 2-4) includes the array of sites used in the normal operating mode.

While FIG. 6 illustrates a fully populated MCM (with 2N+1 redundant sites), depending on the cost trade-offs, the system performance requirements (such as class 3 HPC for three nines availability versus class 4 HPC for four nines availability), the dominant failure modes and the FIT paretos, in some embodiments only a portion of the redundant sites are populated. Thus, in general, MCM 600 may include one or more redundant sites in the multiple sites.

In some embodiments, a given one of the one or more redundant sites, the one or more redundant chips, and/or the one or more redundant components is in the standby mode until a failure or an impending failure is predicted for a corresponding one of the multiple sites, the multiple chips, and/or the multiple components in MCM 600. For example, MCM 600 may include control logic 610 (such as a system controller) that monitors a status of the multiple sites, the multiple chips, and the multiple components during operation of MCM 600. Note that the status may include: performance of the multiple sites, the multiple chips and the multiple components during operation of MCM 600. Alternatively or additionally, the status may include a communication metric associated with the proximity communication, such as a communication metric associated with transmitting or receiving of an optical signal during the proximity communication (for example, a signal amplitude or a signal-to-noise ratio). Alternatively or additionally, the communication metric may include reliability, such as alignment of proximity communication connectors on the chips.

Furthermore, MCM 600 may include a telemetry-monitoring mechanism 612 that monitors parameters associated with operation of the multiple sites, the multiple chips, and the multiple components (such as current, voltage, noise, temperature, resistance, power consumption, loss of signal, vibration, bit-error rate, signal-to-noise ratio, etc.). In these embodiments, the status may be based on the monitored parameters. Additionally, the telemetry-monitoring mechanism may be distributed at two or more locations in MCM 600.

In some embodiments, control logic 610 transitions a given one of the one or more redundant sites (such as site 108-1), the one or more redundant chips, and/or the one or more redundant components from a standby mode to a normal operating mode (which is sometimes referred to as the 'mission mode') based on the status, thereby providing fault tolerance. Note that control logic 610 may be centralized at a particular location in MCM 600, or may be distributed at two or more locations in the MCM 600. Furthermore, note that control logic 610 may transition the modes of one or more components, chips or sites in series or in parallel.

As noted previously, in some embodiments MCM 600 has a fully connected, non-blocking topology so that a given chip at the given site can communicate with any other chip in MCM 600. Moreover, the global redundancy and the local redundancy may preserve the fully connected, non-blocking topology in the event of failures or impending failures of a given one of the one or more redundant sites, the one or more redundant chips, and/or the one or more redundant components.

Furthermore, the option to provision between one and 2N+1 redundant sites may be possible in the embodiments of MCM 600 with the unique fully interconnected topology. In particular, this flexible and scalable sparing technique may leverage the point-to-point link and the multiplexer/demultiplexer WDM features of MCM 600. Note that in a fully redundant system, the resource allocation required may be increased by a factor of $(2N+1)/N^2$. However, the cost of including redundant building blocks on silicon (in the form of additional drivers, modulators, waveguides, multiplexers/demultiplexers, detectors, etc.) may be relatively inexpensive compared to the cost of adding processors and associated packaging. Consequently, it may be economical to include as much device-level redundancy (or local redundancy) as possible within each site. Table 3 provides global and local redundancy configurations in an MCM. These configurations provide estimates of the additional resources needed for different building blocks. The last column on the right shows the components in a full 2N+1-type global redundant implementation with example N equal to 8, and the adjacent column shows the minimum components without a global redundant site.

TABLE 3

| Component | Quantity | Additional components providing 2N + 1 redundancy | Total components without redundancy in an 8x8 array | Additional components providing 2N + 1 redundancy for N = 8 |
|---|---|---|---|---|
| Sites (processors, DRAM, L2 cache, switch, SIU) | $(N + 1)^2$ | $2N + 1$ | 64 | 17 |
| Lasers | $2(N + 1)^4$ | $2[4N^3 + 6N^2 + 4N + 1]$ | 8192 | 4930 |
| Modulators and drivers | $2(N + 1)^4$ | $2[4N^3 + 6N^2 + 4N + 1]$ | 8192 | 4930 |
| Multiplexers | $2(N + 1)^3$ | $2[3N^2 + 3N + 1]$ | 1024 | 434 |
| Demultiplexers | $2(N + 1)^3$ | $2[3N^2 + 3N + 1]$ | 1024 | 434 |
| Detectors and receivers | $2(N + 1)^4$ | $2[4N^3 + 6N^2 + 4N + 1]$ | 8192 | 4930 |
| Routing waveguides | $2(N + 1)^2$ | $2[4N^3 + 6N^2 + 4N + 1]$ | 8192 | 4930 |

At the physical layer, for the global and local redundancy summarized in Table 3: each MCM may include between one and 2N+1 redundant sites; each site may include at least N+1 redundant optical sources (such as lasers) co-located with other active optical sources for that site; each site column and each site row may include between N+1 and $(N+1)^2$ redundant optical sources, which may be co-located with the corresponding optical-source array for each site; each site may include one redundant multiplexer and one redundant demultiplexer; each multiplexer and demultiplexer may include at least one additional optical-source path to link redundant sites, and may include corresponding additional transmit components (such as one or more modulators and/or drivers) and receive components (such as one or more detectors and/or receivers); each site column and each site row may include between one and N+1 additional multiplexers and demultiplexers; and/or each site may be coupled with one additional horizontal waveguide and one additional vertical waveguide. Note that these waveguides may, respectively, be co-located with other horizontal and vertical waveguides. Furthermore, there may be additional waveguide and bridge couplers for each site from the horizontal and vertical waveguides. However, routing layer point-to-point redundancy may be present irrespective of how many redundant sites are populated.

This global redundancy technique may allow for thread, cache and/or processor off-lining within a site, as well as fail-over switching to one or more redundant sites as needed. Furthermore, because of the scalability of the MCM, this redundancy technique may allow fail-over switching to redundant sites within one MCM and/or within a cluster of MCMs.

Figure 7:
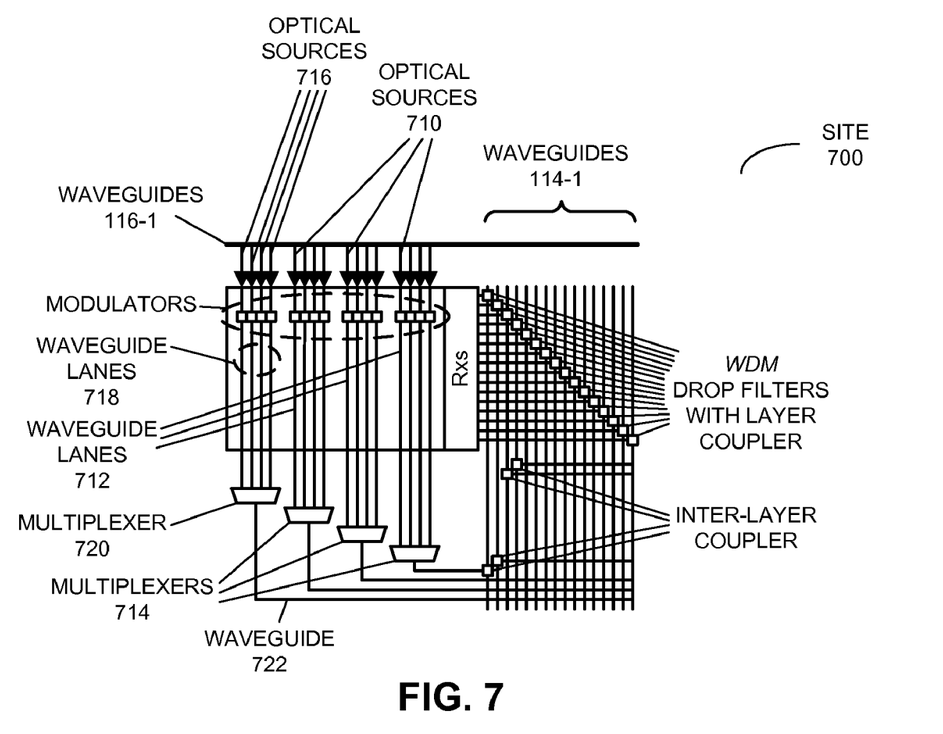
FIG. 7 is a block diagram illustrating local redundancy in the MCM of FIG. 6 in accordance with an embodiment of the present disclosure.

In the preceding discussion, the global and local redundancy provided fail-over to spare sites in the standby mode. However, this redundancy may also provide a benefit in the normal operating mode. This is illustrated in FIG. 7, which presents a block diagram illustrating local redundancy at a given site 700 in MCM 600. In particular, each site now has between N+1 and $(N+1)^2$ additional optical sources (such as lasers). Thus, during the normal operating mode, each physical link (via a multiplexer and a demultiplexer) may have at least one spare or redundant optical source (such as optical sources 710), and may be served by at least one redundant waveguide (such as waveguide lanes 712) to the corresponding multiplexer (such as one of multiplexers 714). In addition, there is a spare or redundant bank of optical sources 716, coupled to redundant waveguide lanes 718, a redundant multiplexer 720 and a redundant waveguide 722. Thus, there are N+1 redundant optical sources for communication to redundant sites.

As noted previously, in addition to the failure modes summarized in Table 2, in a silicon-photonics-based HPC, the optical sources are a potential source of failure, along with other passive and active silicon photonic devices. Silicon photonic components (on silicon) may have FITs comparable to those of other silicon components (or even lower). Therefore, the FITs of the silicon photonic components may be of less concern than the optical-source array (which may have higher FITs), and the focus below is on active optical-source redundancy to overcome failure modes of the optical-source arrays.

In the discussion that follows, lasers are used as illustrative examples of the optical sources. In particular, the lasers may be arranged in an array, in which each laser outputs continuous-wave (CW) power at different wavelengths. Furthermore, each laser may be targeted to address a particular waveguide and receiver combination at a predetermined destination site in the MCM that is tuned to that specific wavelength.

In general, the failure rate depends on random and wear-out failure modes. Note that, depending on material systems (InP, GaAlAs, InAlGaAs), the reliability of the CW-laser arrays (based on edge-emitting DFBs or surface-emitting VCSELs) can be between ten to a hundred FITs in the random failure regime. Directly modulated lasers, such as VCSELs, typically have high-speed requirements (up to 20 Gbps per aperture). Consequently, their aperture sizes may be lowered to reduce device capacitance, and thus to help achieve the dynamic performance. However, this may impact reliability because of current and temperature acceleration and photon interaction over a smaller device volume. In this regard, CW lasers typically have an advantage because their apertures are usually bigger, and therefore tend to have lower temperature and current acceleration of failure modes.

Nonetheless, macro and micro defects can contribute to laser failure. These defects often arise as the result of: a variety of processing steps, material contamination, from cleaving of edge facets, etc. Note that CW lasers are widely deployed in long-haul dense WDM telecommunication links. In such communication systems, the CW lasers are typically temperature stabilized with thermo-electric coolers (TECs) for operation at a stable temperature of 25 C, which can prevent wavelength drift with temperature, and because the laser reliability is known to be very good when there is a low temperature of operation. At this low temperature, the dominant failure mode is typically associated with macro defects, which have low activation energies.

In an MCM environment, the operating temperature may be between 40 and 75 C. Therefore, the CW-laser array failure modes may include both macro defects and micro defects (which have higher activation energy). It is reasonable to expect that a CW-laser FIT will be lower than that of the directly modulated lasers. Random or wear-out failures of a laser can be reduced by proper wafer-level screening, as well as by controlling the epitaxial growth and device processing operations. Nonetheless, laser failure may be a dominant failure mode in silicon photonic MCMs. If one or many of the lasers within the array fails (e.g., the optical power drops by more than 2 dB), then those lasers may need to be removed from system use and replaced with redundant lasers from the local redundancy. A spare laser can be turned on and the optical power can be stabilized to deliver CW power within a few seconds. In some embodiments, the standby lasers are turned on as soon as system telemetry signals indicate that a laser is failing, which could facilitate immediate fail-over switching to a spare laser without waiting a few seconds. During the fail-over to the spare laser(s), communication between the corresponding transmit and receive processors may be interrupted, and a fail-over sequence at the processor level may be initiated and/or the processor may be temporarily off-lined.

The local redundancy in the 2N+1 redundancy technique may include at least N+1 spare lasers per site, which are readily available for use. When a laser fails or is about to fail, a new laser wavelength may be chosen from the spare lasers, and the receiver (which was coupled to the previous laser) may be 'tuned' to the new wavelength of the spare laser. Note that the path for this new laser, which is deployed into service, may be the same waveguide path as before except that it is now at a slightly different wavelength. This may only be possible with the multiplexing and selection of the horizontal and vertical waveguide combination in the WDM point-to-point implementation of the MCM.

In an exemplary embodiment of this implementation, the local redundancy at each site may include: between N+1 and $(N+1)^2$ redundant lasers, which allows site-level sparing, as well as within-site sparing of failed lasers; co-located spare waveguide lanes from the spare laser for a corresponding multiplexer; and/or a co-located spare multiplexer with additional waveguide lanes from the spare laser array to spare sites on the column and the row in the MCM.

Note that switching to a spare laser or spare laser array may be controlled by control logic 610 (FIG. 6) based on system telemetry. During this switching operation, processor-specific communication on the failed or failing channel may be temporarily off-lined or disabled, including threads and cores that use the affected carrier wavelength(s). This communication may be managed by the operating system in conjunction with control logic 610 (FIG. 6).

Furthermore, the laser array may be controlled at the system level. For example, laser-specific control logic (such as the system controller) may map a unique wavelength to the horizontal and vertical routing waveguides, and thus to the corresponding receiver site, thereby allowing communication between two processor nodes. In the event of a laser failure: one of the spare lasers may be turned on; data may be sent on the same waveguides; and the control logic may tune the same receiver to this new wavelength, thereby re-establishing communication between the same two processor nodes.

Additionally, the laser-specific control logic may manage wavelength allocation and receiver matching (via tuning), as well as dynamically allocating spare lasers for laser failures within a site, and fail-over allocation of lasers to spare sites. In some embodiments, the laser-specific control logic uses a predetermined mechanism to select the appropriate laser source from the spare lasers, including the wavelength choice and the mapping to corresponding waveguides. For example, there may be a predetermined look-up table.

Additionally, spare units can be either standby spares or 'hot spares,' in which the 'hot spares' are also powered up when other components are powered.

Figure 8:
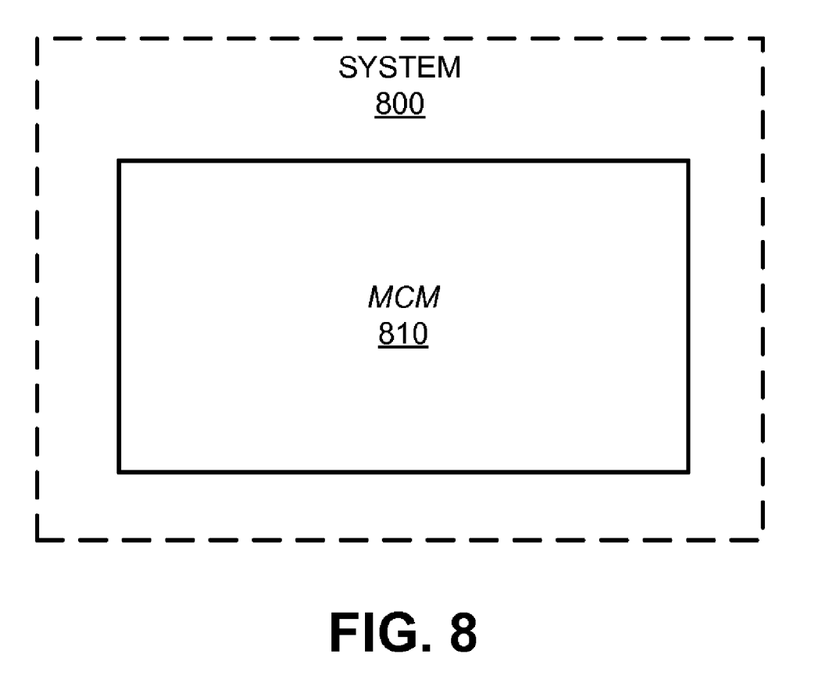
FIG. 8 is a block diagram illustrating a system that includes an MCM in accordance with an embodiment of the present disclosure.

Embodiments of the MCM may be used in a wide variety of applications. This is shown in FIG. 8, which presents a block diagram illustrating a system 800 that includes an MCM 810, such as one of the preceding embodiments of the MCM. In general, an MCM may include an array of chip modules (CMs) or single-chip modules (SCMs), and a given SCM may include at least one substrate, such as a semiconductor die. Furthermore, the substrate may communicate with other substrates, CMs, SCMs, and/or optical devices in the MCM using: optical proximity communication, proximity communication of capacitively coupled signals, and/or proximity communication of inductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple processor-core computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that system 800 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCM 100 (FIG. 1), link 400 (FIG. 4), MCM 500 (FIG. 5), MCM 600 (FIG. 6), site 700 (FIG. 7) and/or system 800 may include fewer components or additional components. Furthermore, although these MCMs, links, sites and systems are illustrated as having a number of discrete items, they are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the MCMs, link, site and system may be implemented more in hardware and less in software, or less in hardware and more in software, as is known in the art. For example, functionality may be implemented in one or more application-specific integrated circuits (ASICs) and/or one or more digital signal processors (DSPs).

Figure 9:
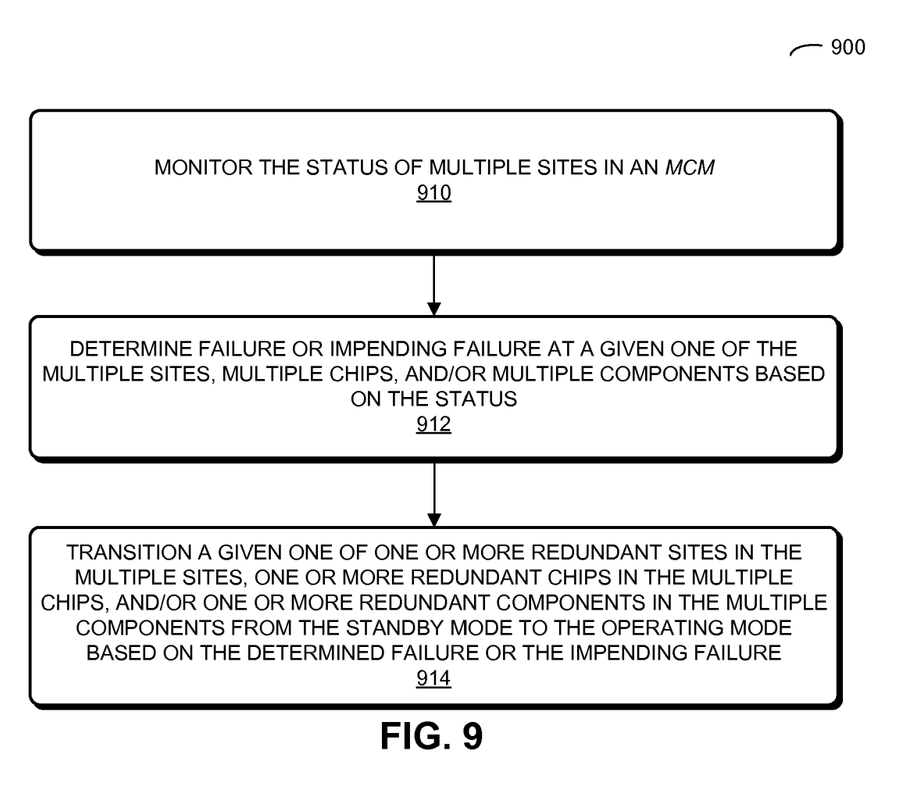
FIG. 9 is a flow diagram illustrating a process for operating an MCM in accordance with an embodiment of the present disclosure.

We now describe embodiments of a process. FIG. 9 presents a flow diagram illustrating a process 900 for operating an MCM, such as one of the preceding embodiments of the MCM. During operation, the status of multiple sites in the MCM is monitored (operation 910), including multiple chips at the given site that communicate information within the MCM through proximity communication via multiple components associated with the given site. Then, a failure or impending failure is determined at a given one of the multiple sites, the multiple chips, and/or the multiple components based on the status (operation 912). Next, a given one of one or more redundant sites in the multiple sites, one or more redundant chips in the multiple chips, and/or one or more redundant components in the multiple components is transitioned from the standby mode to the operating mode based on the determined failure or the impending failure (operation 914).

In some embodiments, process 900 includes additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising multiple sites, wherein a given site in the multiple sites includes:
    multiple chips with proximity connectors that communicate information through proximity communication within the MCM via multiple components associated with the given site, wherein the MCM includes global redundancy and local redundancy at the given site;
    wherein the global redundancy involves providing one or more redundant sites in the multiple sites;
    wherein the local redundancy involves providing one or more redundant chips in the multiple chips and one or more redundant components in the multiple components,
    wherein the one or more redundant components comprise a plurality of spare lasers for each site, and wherein, when a laser for the given site fails or is about to fail, a new laser wavelength is chosen from the spare lasers for the given site and a receiver that was coupled to the laser is tuned to the new laser wavelength.

2. The MCM of claim 1, wherein a given one of the one or more redundant sites, the one or more redundant chips, or the one or more redundant components is in a standby mode until a failure or an impending failure of a corresponding one of the multiple sites, the multiple chips, or the multiple components is detected in the MCM.

3. The MCM of claim 1, further comprising control logic configured to monitor a status of the multiple sites, the multiple chips, and the multiple components during operation of the MCM.

4. The MCM of claim 3, wherein the status includes performance of the multiple sites, the multiple chips and the multiple components during operation of the MCM.

5. The MCM of claim 3, wherein the status includes a communication metric associated with the proximity communication.

6. The MCM of claim 5, wherein the communication metric is associated with transmitting or receiving of an optical signal during the proximity communication, wherein the communication metric comprises an alignment of connectors for the proximity communication.

7. The MCM of claim 3, further comprising a telemetry-monitoring mechanism configured to monitor parameters associated with operation of the multiple sites, the multiple chips, and the multiple components, wherein the status is based on the monitored parameters.

8. The MCM of claim 7, wherein the telemetry-monitoring mechanism is distributed at two or more locations in the MCM.

9. The MCM of claim 3, wherein the control logic is configured to transition a given one of the one or more redundant sites, the one or more redundant chips, or the one or more redundant components from a standby mode to an operating mode based on the status.

10. The MCM of claim 3, wherein the control logic is centralized at a particular location in the MCM.

11. The MCM of claim 3, wherein the control logic is distributed at two or more locations in the MCM.

12. The MCM of claim 1, wherein the proximity communication includes optical proximity communication of optical signals.

13. The MCM of claim 12, further comprising optical links, wherein the optical proximity communication between a given pair of the multiple chips occurs via one or more of the optical links.

14. The MCM of claim 1, wherein the multiple components include optical sources.

15. The MCM of claim 1, wherein the MCM has a fully connected, non-blocking topology so that a given chip at the given site can communicate with any other chip in the MCM.

16. The MCM of claim 15, wherein the global redundancy and the local redundancy preserve the fully connected, non-blocking topology in the event of failures or impending failures of a given one of the one or more redundant sites, the one or more redundant chips, or the one or more redundant components.

17. A system, comprising an MCM, wherein the MCM includes multiple sites, and wherein a given site in the multiple sites includes:
    multiple chips with proximity connectors that communicate information through proximity communication within the MCM via multiple components associated with the given site, wherein the MCM includes global redundancy and local redundancy at the given site;
    wherein the global redundancy involves providing one or more redundant sites in the multiple sites; and
    wherein the local redundancy involves providing one or more redundant chips in the multiple chips and one or more redundant components in the multiple components,
    wherein the one or more redundant components comprise a plurality of spare lasers for each site, and wherein, when a laser for the given site fails or is about to fail, a new laser wavelength is chosen from the spare lasers for the given site and a receiver that was coupled to the laser is tuned to the new laser wavelength.

18. The system of claim 17, further comprising control logic configured to monitor a status of the multiple sites, the multiple chips, and the multiple components during operation of the MCM.

19. The system of claim 17, wherein the control logic is configured to transition a given one of the one or more redundant sites, the one or more redundant chips, or the one or more redundant components from a standby mode to an operating mode based on the status.

20. A method for operating an MCM, comprising:
    monitoring a status of multiple sites in the MCM, including multiple chips at a given site that communicate information within the MCM through proximity communication via multiple components associated with the given site;
    determining that a failure has occurred or is impending at a given one of the multiple sites, the multiple chips, or the multiple components based on the status; and transitioning a given one of one or more redundant sites in the multiple sites, one or more redundant chips in the multiple chips, or one or more redundant components in the multiple components from a standby mode to an operating mode based on the determined failure or the impending failure,
wherein the one or more redundant components comprise a plurality of spare lasers for each site, and wherein, when a laser for the given site fails or is about to fail, a new laser wavelength is chosen from the spare lasers for the given site and a receiver that was coupled to the laser is tuned to the new laser wavelength.

* * * * *

UNITED STATES PATENT AND TRADEMARK OFFICE
CERTIFICATE OF CORRECTION

PATENT NO. : 8,207,752 B2
APPLICATION NO. : 12/685159
DATED : June 26, 2012
INVENTOR(S) : Kannan Raj et al.

It is certified that error appears in the above-identified patent and that said Letters Patent is hereby corrected as shown below:

ON THE TITLE PAGE:

Insert,

Item --(73) Assignee: ORACLE AMERICA, INC., REDWOOD SHORES, CA--

Signed and Sealed this
Seventh Day of August, 2012

David J. Kappos
*Director of the United States Patent and Trademark Office*